United States Patent
Liu et al.

(10) Patent No.: US 8,682,625 B2
(45) Date of Patent: Mar. 25, 2014

(54) METHODS, SYSTEMS, AND COMPUTER-READABLE MEDIA FOR IMPROVING ACCURACY OF NETWORK PARAMETER IN ELECTROMAGNETIC SIMULATION AND MODELING

(75) Inventors: Jian Liu, Los Gatos, CA (US); Kaiyu Mao, San Jose, CA (US); Jiayuan Fang, Saratoga, CA (US)

(73) Assignee: Sigrity, Inc., Campbell, CA (US)

( * ) Notice: Subject to any disclaimer, the term of this patent is extended or adjusted under 35 U.S.C. 154(b) by 266 days.

(21) Appl. No.: 13/294,325

(22) Filed: Nov. 11, 2011

(65) Prior Publication Data

US 2013/0124181 A1    May 16, 2013

(51) Int. Cl.
*G06F 17/50* (2006.01)

(52) U.S. Cl.
USPC .................................. 703/2; 703/14; 703/19

(58) Field of Classification Search
USPC .................................. 703/2, 14, 19
See application file for complete search history.

(56) References Cited

U.S. PATENT DOCUMENTS

| | | | | |
|---|---|---|---|---|
| 6,735,630 | B1 * | 5/2004 | Gelvin et al. | 709/224 |
| 8,315,327 | B2 * | 11/2012 | Agee et al. | 375/267 |
| 8,451,928 | B2 * | 5/2013 | Agee et al. | 375/267 |
| 8,451,929 | B2 * | 5/2013 | Agee et al. | 375/267 |

* cited by examiner

*Primary Examiner* — Thai Phan
(74) *Attorney, Agent, or Firm* — Kenyon & Kenyon LLP

(57) ABSTRACT

Method, system, and computer readable medium are disclosed for analyzing electrical properties of a circuit. The method may comprise: providing a network model including at least one network parameter, the network parameter being defined over a frequency range; converting the network parameter into an intermediate network parameter having first and second portions; identifying first and second frequencies defining a frequency sub-range; replacing the first portion of the intermediate network parameter with a DC value when a frequency associated with the intermediate network parameter is lower than the first frequency; replacing the first portion of the intermediate network parameter with a transitional value when the frequency associated with the intermediate network parameter is within the frequency sub-range; and converting the intermediate network parameter with the replaced first portion into an updated network parameter.

36 Claims, 11 Drawing Sheets

METHODS, SYSTEMS, AND COMPUTER-READABLE MEDIA FOR IMPROVING ACCURACY OF NETWORK PARAMETER IN ELECTROMAGNETIC SIMULATION AND MODELING

TECHNICAL FIELD

The present invention relates to methods, systems, and computer-readable media for simulating and modeling electrical components, interconnects, and circuits. More particularly, the present invention relates to methods, systems, and computer-readable media for improving accuracy of network parameters over a frequency range.

BACKGROUND

In electromagnetic simulation and analysis, network models are often utilized for analyzing electrical components, circuits, and systems. Network models may be characterized by network parameters, such as impedance parameters (Z-parameters), admittance parameters (Y-parameters), and scattering parameters (S-parameters).

S-parameters are often used in applications involving relatively high frequencies, such as RF and microwave frequency ranges. In low frequency domain including direct current condition (zero frequency), however, S-parameters measured or calculated using traditional methods may suffer from low accuracy. Accordingly, there is a need for a system and method for improving accuracy of S-parameters in a relatively wide spectrum.

SUMMARY

In one embodiment, there is provided a method for analyzing electrical properties of a circuit. The method may comprise: providing a network model of the circuit having at least one port, wherein the network model includes at least one network parameter, the network parameter being associated with the port and being defined over a frequency range; converting the network parameter into an intermediate network parameter; the intermediate network parameter having first and second portions; providing a value indicative of an electrical property of the port in a direct current (DC) condition; identifying first and second frequencies in the frequency range, the first frequency being lower than the second frequency, wherein the first and second frequencies define a frequency sub-range; replacing the first portion of the intermediate network parameter with the value when a frequency associated with the intermediate network parameter is lower than the first frequency; replacing the first portion of the intermediate network parameter with a transitional value when the frequency associated with the intermediate network parameter is within the frequency sub-range; and converting the intermediate network parameter with the replaced first portion into an updated network parameter. It is noted that the replacement of the first portion of the intermediate network parameter with the value in DC condition can be applied to any frequency lower than the first frequency. Similarly, the replacement of the first portion of the intermediate network parameter with the transitional value can be applied to any frequency within the frequency sub-range.

In another embodiment, there is provided a computer-readable medium encoded with software code instructions, when executed by a computer, implementing a method for analyzing electrical properties of a circuit. The method may comprise: providing a network model of the circuit having at least one port, wherein the network model includes at least one network parameter, the network parameter being associated with the port and being defined over a frequency range; converting the network parameter into an intermediate network parameter; the intermediate network parameter having first and second portions; providing a value indicative of an electrical property of the port in a direct current (DC) condition; identifying first and second frequencies in the frequency range, the first frequency being lower than the second frequency, wherein the first and second frequencies define a frequency sub-range; replacing the first portion of the intermediate network parameter with the value when a frequency associated with the intermediate network parameter is lower than the first frequency; replacing the first portion of the intermediate network parameter with a transitional value when the frequency associated with the intermediate network parameter is within the frequency sub-range; and converting the intermediate network parameter with the replaced first portion into an updated network parameter. It is noted that the replacement of the first portion of the intermediate network parameter with the value in DC condition can be applied to any frequency lower than the first frequency. Similarly, the replacement of the first portion of the intermediate network parameter with the transitional value can be applied to any frequency within the frequency sub-range.

In a third embodiment, there is provided a system for simulating electrical properties of a circuit. The system may comprise a processor and a memory communicatively coupled to the processor. The processor may be configured to: load a network model of the circuit into the memory, wherein the network model includes at least one port and at least one network parameter, the network parameter being associated with the port and being defined over a frequency range; convert the network parameter into an intermediate network parameter; the intermediate network parameter having first and second portions; obtain a value indicative of an electrical property of the port in a direct current (DC) condition; identify first and second frequencies in the frequency range, the first frequency being lower than the second frequency, wherein the first and second frequencies define a frequency sub-range; replace the first portion of the intermediate network parameter with the value when a frequency associated with the intermediate network parameter is lower than the first frequency; replace the first portion of the intermediate network parameter with a transitional value when the frequency associated with the intermediate network parameter is within the frequency sub-range; and convert the intermediate network parameter with the replaced first portion into an updated network parameter. It is noted that the replacement of the first portion of the intermediate network parameter with the value in DC condition can be applied to any frequency lower than the first frequency. Similarly, the replacement of the first portion of the intermediate network parameter with the transitional value can be applied to any frequency within the frequency sub-range.

The preceding summary is not intended to restrict in any way the scope of the claimed invention. In addition, it is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments and exemplary aspects of the present invention and, together with the description, explain principles of the invention. In the drawings.

DESCRIPTION OF EXEMPLARY EMBODIMENTS

Reference will now be made in detail to exemplary embodiments of the invention, examples of which are illustrated in the accompanying drawings. When appropriate, the same reference numbers are used throughout the drawings to refer to the same or like parts.

Embodiments of the present disclosure may involve system, method, and computer-readable medium for simulating and/or analyzing an electrical circuit. The term "electrical circuit" (or "circuit") may refer to any path which electrons from a voltage or current source follow. Electrical circuits may be physically implemented on circuit structures such as integrated circuit (IC) chips, modules, chip or module carriers, cards, boards, and/or back-planes. Such circuit structures may include multiple layers to sandwich electronic components and/or signal/power/ground lines. During design, fabrication, and/or testing of electrical circuits, computer simulation may be performed to analyze, evaluate, and/or verify electrical properties and/or behaviors of the circuits.

Figure 1:
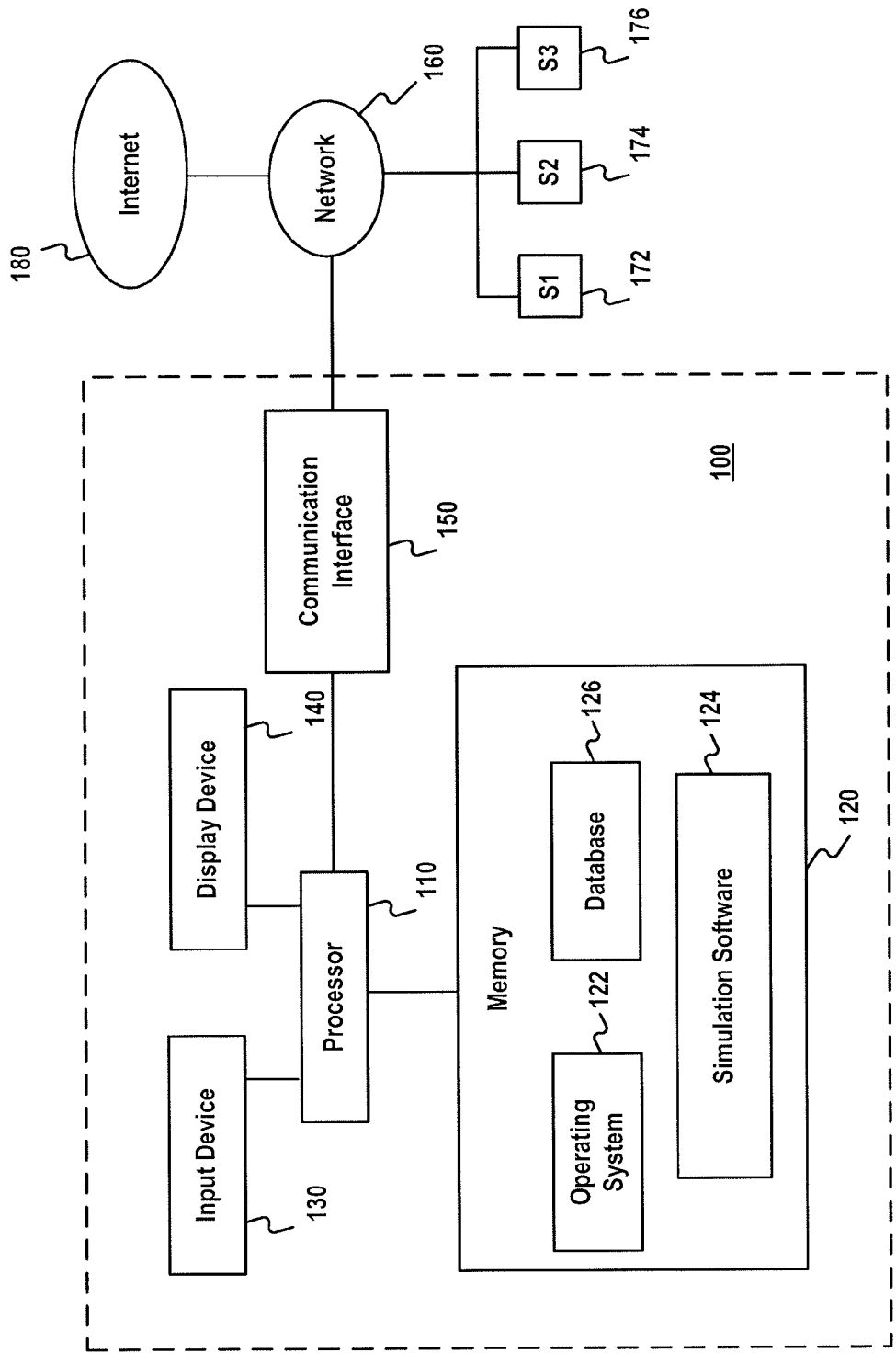
FIG. 1 shows an exemplary system for simulating and/or analyzing an electrical circuit, consistent with some disclosed embodiments.

FIG. 1 shows an exemplary system 100 for simulating an electrical circuit. Consistent with some embodiments, system 100 may be a general purpose computer, or a computing device dedicated for simulation. As shown in FIG. 1, system 100 may include a processor 110, a memory module 120, a user input device 130, a display device 140, and a communication interface 150. Processor 110 can be a central processing unit ("CPU") or a graphic processing unit ("CPU"). Depending on the type of hardware being used, processor 110 can include one or more printed circuit boards, and/or a microprocessor chip. Processor 110 can execute sequences of computer program instructions to perform various methods that will be explained in greater detail below.

Memory module 120 can include, among other things, a random access memory ("RAM") and a read-only memory ("ROM"). The computer program instructions can be accessed and read from the ROM, or any other suitable memory location, and loaded into the RAM for execution by processor 110. For example, memory module 120 may store one or more software applications. Software applications stored in memory module 120 may comprise operating system 122 for common computer systems as well as for software-controlled devices. Further, memory module may store an entire software application or only a part of a software application that is executable by processor 110.

In some embodiments, memory module 120 may store simulation software 124 that may be executed by processor 110. For example, simulation software 124 may be executed to simulate electrical behaviors/properties of electrical circuits. It is also contemplated that simulation software 124 or portions of it may be stored on a removable computer readable medium, such as a hard drive, computer disk, CD-ROM, DVD±R, CD±RW or DVD±RW, HD or Blu-ray DVD, USB flash drive, SD card, memory stick, or any other suitable medium, and may run on any suitable component of system 100. For example, portions of applications to perform simulation may reside on a removable computer readable medium and be read and acted upon by processor 110 using routines that have been copied to memory 120.

In some embodiments, memory module 120 may also store master data, user data, application data and/or program code. For example, memory module 120 may store a database 126 having therein various simulation data used for simulating electrical circuits.

In some embodiments, input device 130 and display device 140 may be coupled to processor 110 through appropriate interfacing circuitry. In some embodiments, input device 130 may be a hardware keyboard, a keypad, or a touch screen, through which a user may input information to system 100. Display device 140 may include one or more display screens that display the simulation interface, result, or any related information to the user.

Communication interface 150 may provide communication connections such that system 100 may exchange data with external devices. For example, system 100 may be connected to network 160. Network 160 may be a LAN or WAN that may include other systems S1 (172), S2 (174), and S3 (176). Systems S1, S2, and/or S3 may be identical to system 100, or may be different systems. In some embodiments, one or more of systems in network 160 may form a distributed computing/simulation environment that collaboratively performs simulation task. In addition, network 160 may be connected to Internet 180 to communicate with servers or clients that reside remotely on the Internet.

Figure 2A:
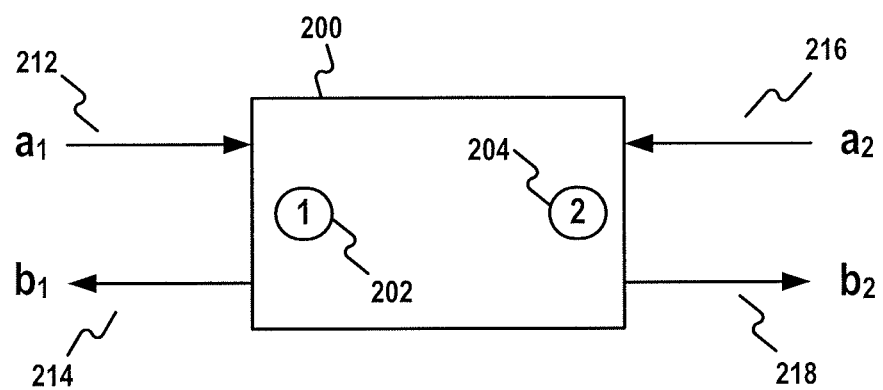
FIGS. 2A and 2B are schematic diagrams of a network model, in accordance with some disclosed embodiments.

FIG. 2A illustrates an exemplary network model. The term "network," also known as "electrical network," refers to an interconnection of electrical elements such as resistors, inductors, capacitors, transmission lines, voltage sources, current sources, switches, etc. A network may include one or more ports. A port may be a point at which electrical currents either enter or exit a network. The term "network model" refers to a mathematical representation of a physical network. A network model may include graphical representations of the network and associated ports. A network model may also include a set of mathematical expressions and/or values that characterize the properties and/or behaviors of the network. As used herein, a network model may also be referred to as a network for simplicity.

Referring to FIG. 2A, network 200 may include two ports: port 1 (202) and port 2 (204). In general, a network may include any number of ports. For each port, incident waves and reflected waves may be defined. For example, for port 1 (202), $a_1$ (212) represents incident waves and $b_1$ (214) represents reflected waves. Similarly, for port 2 (204), $a_2$ (216) represents incident waves and $b_2$ (218) represents reflected waves. The incident and reflected waves may be represented as voltage travelling waves incident and reflected from a port normalized to a reference impedance $Z_0$ such that when squared the waves are equal to the power traveling along the line connecting to the port. For example, for the network 200 in FIG. 2, the incident and reflected waves on ports 1 and 2 may be represented as:

$$a_1 = \frac{V_{i1}}{\sqrt{Z_{01}}};\qquad(1)$$

$$b_1 = \frac{V_{r1}}{\sqrt{Z_{01}}};\qquad(2)$$

$$a_2 = \frac{V_{i2}}{\sqrt{Z_{02}}};\text{ and}\qquad(3)$$

$$b_2 = \frac{V_{r2}}{\sqrt{Z_{02}}}.\qquad(4)$$

In equations (1)-(4), $V_{i1}$ and $V_{i2}$ are voltage traveling waves incident on ports 1 and 2, respectively. $V_{r1}$ and $V_{r2}$ are voltage traveling waves reflected from ports 1 and 2, respectively. $Z_{01}$ and $Z_{02}$ are reference impedance of ports 1 and 2, respectively. A set of network parameters may be expressed as:

$$\begin{pmatrix}b_1\\b_2\end{pmatrix}=\begin{pmatrix}S_{11}&S_{12}\\S_{21}&S_{22}\end{pmatrix}\begin{pmatrix}a_1\\a_2\end{pmatrix}.\qquad(5)$$

The network parameters defined by equation (5) are normally called scattering parameters, or S-parameters. When expended, equation (5) becomes:

$$b_1 = S_{11}a_1 + S_{12}a_2;\text{ and}\qquad(6)$$

$$b_2 = S_{21}a_1 + S_{22}a_2.\qquad(7)$$

The network parameters are therefore:

$$S_{11} = \frac{b_1}{a_1}\bigg|(a_2=0);\qquad(8)$$

$$S_{21} = \frac{b_2}{a_1}\bigg|(a_2=0);\qquad(9)$$

$$S_{12} = \frac{b_1}{a_2}\bigg|(a_1=0);\text{ and}\qquad(10)$$

$$S_{22} = \frac{b_2}{a_2}\bigg|(a_1=0).\qquad(11)$$

If defining port 1 as an input port and port 2 as an output port, $S_{11}$ may also be referred to as input reflection coefficient when port 2 is matched terminated; $S_{21}$ may also be referred to as forward transmission coefficient when port 2 is matched terminated; $S_{12}$ may also be referred to as reverse transmission coefficient when port 1 is matched terminated; and $S_{22}$ may also be referred to as output reflection coefficient when port 1 is matched terminated. As used herein, a port is terminated when the port is connected to a load. A port is matched terminated when the port is connected to a load having an impedance equal to the characteristic impedance of the port, so that no wave is reflected from the load into the port. In general, either port 1 or port 2 may be an input port.

When port 2 is connected to a load having an impedance equal to $Z_{02}$ (also known as terminated in $Z_{02}$), no wave is reflected back into port 2, therefore $a_2=0$. $S_{21}$ and $S_{11}$ can be related by the following equation:

$$S_{21} = \frac{\sqrt{Z_{01}}}{\sqrt{Z_{02}}} \times \frac{V_{out}}{V_{in}}(1+S_{11}),\qquad(12)$$

where $$V_{in}=\sqrt{Z_{01}}(a_1+b_1)),\text{ and}\qquad(13)$$

$$V_{out}=\sqrt{Z_{02}}b_2.\qquad(14)$$

As used herein, a characteristic impedance refers to the physical impedance of a transmission line or waveguide. A reference impedance refers to a port impedance to which network parameters can be referenced. The reference impedance can be arbitrary and form the basis for the network parameter calculations. For example, the definition of $S_{ij}$ implies that all ports except for port j are terminated in their reference impedance and the source impedance of port j is equal to its reference impedance.

Figure 2B:
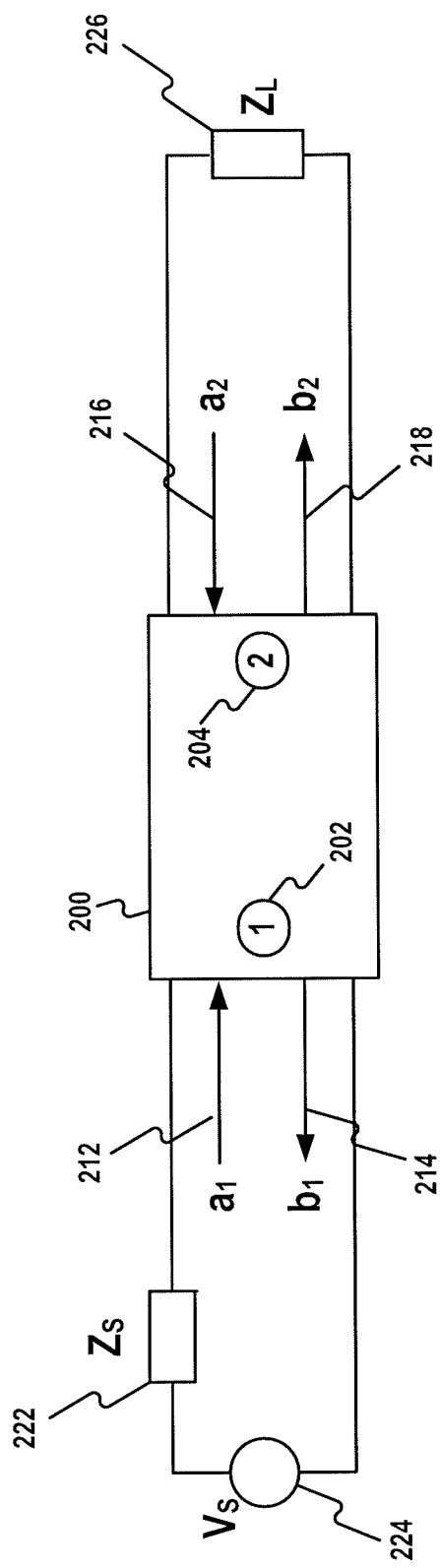

Referring to FIG. 2B, network 200 is now connected to a voltage source 224 at port 1 and a load 226 at port 2. Voltage source 224 has a voltage of $V_S$ and a source impedance of $Z_S$, which is represented by impedance 222. Load 226 has a load impedance $Z_L$. Further, the reference impedance of ports 1 and 2 are $Z_{01}$ and $Z_{02}$, respectively. Input impedance $Z_1$ at port 1 can be defined as the impedance across the terminals of port 1 when port 2 is terminated by load 226 while source 224 and source impedance 222 are disconnected. Similarly, output impedance Z2 at port 2 can be defined as the impedance across the terminals of port 2 with load 226 disconnected and source 224 replaced by a short circuit. In this case, source impedance 222 terminates port 1. For the network model in FIG. 2B, the following coefficients can be derived.

Load reflection coefficient $\Gamma_L$ can be represented by:

$$\Gamma_L = \frac{Z_L - Z_{02}}{Z_L + Z_{02}}.\qquad(15)$$

Source reflection coefficient $\Gamma_S$ can be represented by:

$$\Gamma_S = \frac{Z_S - Z_{01}}{Z_S + Z_{01}}.\qquad(16)$$

Input reflection coefficient $\Gamma_1$ and output reflection coefficient $\Gamma_2$ can be represented by:

$$\Gamma_1 = \frac{Z_1 - Z_{01}}{Z_1 + Z_{01}} = \frac{b_1}{a_1},\text{ and}\qquad(17)$$

$$\Gamma_2 = \frac{Z_2 - Z_{02}}{Z_2 + Z_{02}} = \frac{b_2}{a_2}.\qquad(18)$$

Therefore, from equations (6), (7), and (15)-(18), input reflection coefficient $\Gamma_1$ and output reflection coefficient $\Gamma_2$ can be represented in terms of S-parameters as:

$$\Gamma_1 = S_{11} + \frac{S_{12}S_{21}\Gamma_L}{1 - S_{22}\Gamma_L},\text{ and}\qquad(19)$$

$$\Gamma_2 = S_{22} + \frac{S_{21}S_{12}\Gamma_S}{1 - S_{11}\Gamma_S}.\qquad(20)$$

Therefore, if a matched load is used to terminate port 2 then $\Gamma_L=0$, and equation (19) becomes $\Gamma_1=S_{11}$. Similarly, if $Z_S=Z_{01}$ then port 1 is matched and $\Gamma_S=0$, equation (20) becomes $\Gamma_2=S_{22}$.

Network parameters can be defined over a frequency range. The frequency range can include direct current (DC), i.e., zero frequency, up to high frequency domains, such as RF, microwave, or even higher frequencies. For example, S-parameters can be measured or calculated at different frequencies. At each frequency, a set of S-parameters (e.g., S-parameter matrix) can be obtained. Similarly, for individual S-parameter, e.g., $S_{11}$ in a two-port network, such as network 200, an array of $S_{11}$ values against frequencies can also be obtained by measurement or calculation. It is noted that network parameter, such as S-parameters, are normally complex numbers, i.e., numbers with real and imaginary parts or equivalently, magnitude (or modulus or absolute value) and phase (or argument), therefore, when plotting S-parameter values against frequencies, either magnitude or real part of the complex S-parameter is used to represent a data point.

Figure 5A:
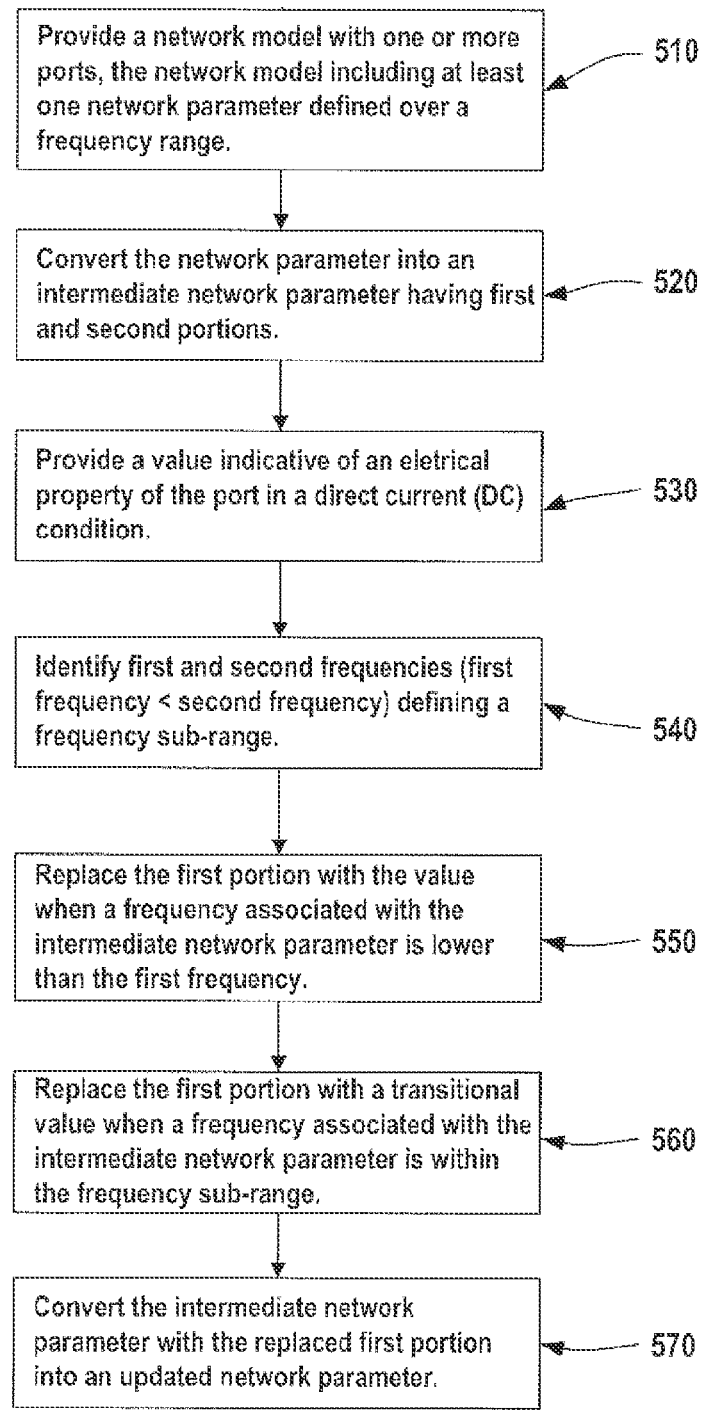
FIGS. 5A-5D show flow charts of exemplary methods for network parameter accuracy improvement, in accordance with some disclosed embodiments.

FIGS. 5A-5D show flow charts of exemplary methods for network parameter accuracy improvement. In FIG. 5A, a method 500 may include a series of steps, in accordance with some embodiments. In step 510, there may be provided a network model with one or more ports (e.g., network 200 with port 202). The network model may include at least one network parameter (e.g., S-parameter) defined over a frequency range (e.g., frequency range 10.sup.0 to 10.sup.8 in FIG. 3). In step 520, the network parameter (e.g., S-parameter) may be converted into an intermediate network parameter (e.g., Z-parameter or Y-parameter) having first and second portions (e.g., real and imaginary parts). In step 530, there may be provided a value indicative of an electrical property of the port in a direct current (DC) condition (e.g., DC value 302 in FIG. 3, which is indicative of port admittance). In step 540, first and second frequencies (e.g., frequencies 306 and 308 in FIG. 3) may be identified to define a frequency sub-range. In step 550, the first portion of the intermediate network parameter (e.g., real part of Z-parameter or Y-parameter) can be replaced with the value (e.g., DC value 302) when a frequency associated with the intermediate network parameter is lower than the first frequency (e.g., frequency at 306). In step 560, the first portion of the intermediate network parameter (e.g., real part of Z-parameter or Y-parameter) may be replaced with a transitional value (e.g., transitional value calculated by a polynomial function or a smoothing function) when a frequency associated with the intermediate network parameter is within the frequency sub-range (e.g., a portion of curve 304 starting at point 306 and ending at point 308). In step 570, the intermediate network parameter with the replaced first portion may be converted into an updated network parameter (e.g., an updated S-parameter). The method 500 may be part of another method that includes more steps.

On the other hand, methods specialized for DC analysis may provide high accuracy results at DC. Therefore, the accuracy of S-parameter over a wide frequency range may be improved by combining accurate DC results (obtained from methods specialized for DC analysis) and S-parameter results in higher frequency domain.

S-parameters can be converted into Z-parameters or Y-parameters, and vice versa. For example, Z-parameters of a network are related to its S-parameters by:

$$Z=\sqrt{z}(1_N+S)(1_N-S)^{-1}\sqrt{z}, \text{ and} \quad (21)$$

$$S=(\sqrt{y}Z\sqrt{y}-1_N)(\sqrt{y}Z\sqrt{y}+1_N)^{-1}, \quad (22)$$

where $1_N$ is an identity matrix of size N (i.e., N-by-N matrix with ones on the main diagonal and zeros elsewhere), $\sqrt{z}$ is a diagonal matrix having the square root of the characteristic impedance at each port as its non-zero elements:

$$\sqrt{z} = \begin{pmatrix} \sqrt{z_{01}} & & & \\ & \sqrt{z_{02}} & & \\ & & \ddots & \\ & & & \sqrt{z_{0N}} \end{pmatrix}, \quad (23)$$

and $\sqrt{y}=(\sqrt{z})^{-1}$ the corresponding diagonal matrix of square roots of characteristic admittance.

Similarly, Y-parameters of a network are related to its S-parameters by:

$$Y=\sqrt{y}(1_N-S)(1_N+S)^{-1}\sqrt{y}, \text{ and} \quad (24)$$

$$S=(1_N-\sqrt{z}Y\sqrt{z})(1_N+\sqrt{z}Y\sqrt{z})^{-1}. \quad (25)$$

As discussed above, network parameters are normally complex numbers having real and imaginary parts. For example, S-parameters can have real and imaginary parts, when converted to Z-parameters (equation 21) or Y-parameters (equation 24), the corresponding Z-parameters or Y-parameters can also have real and imaginary parts.

Figure 3:
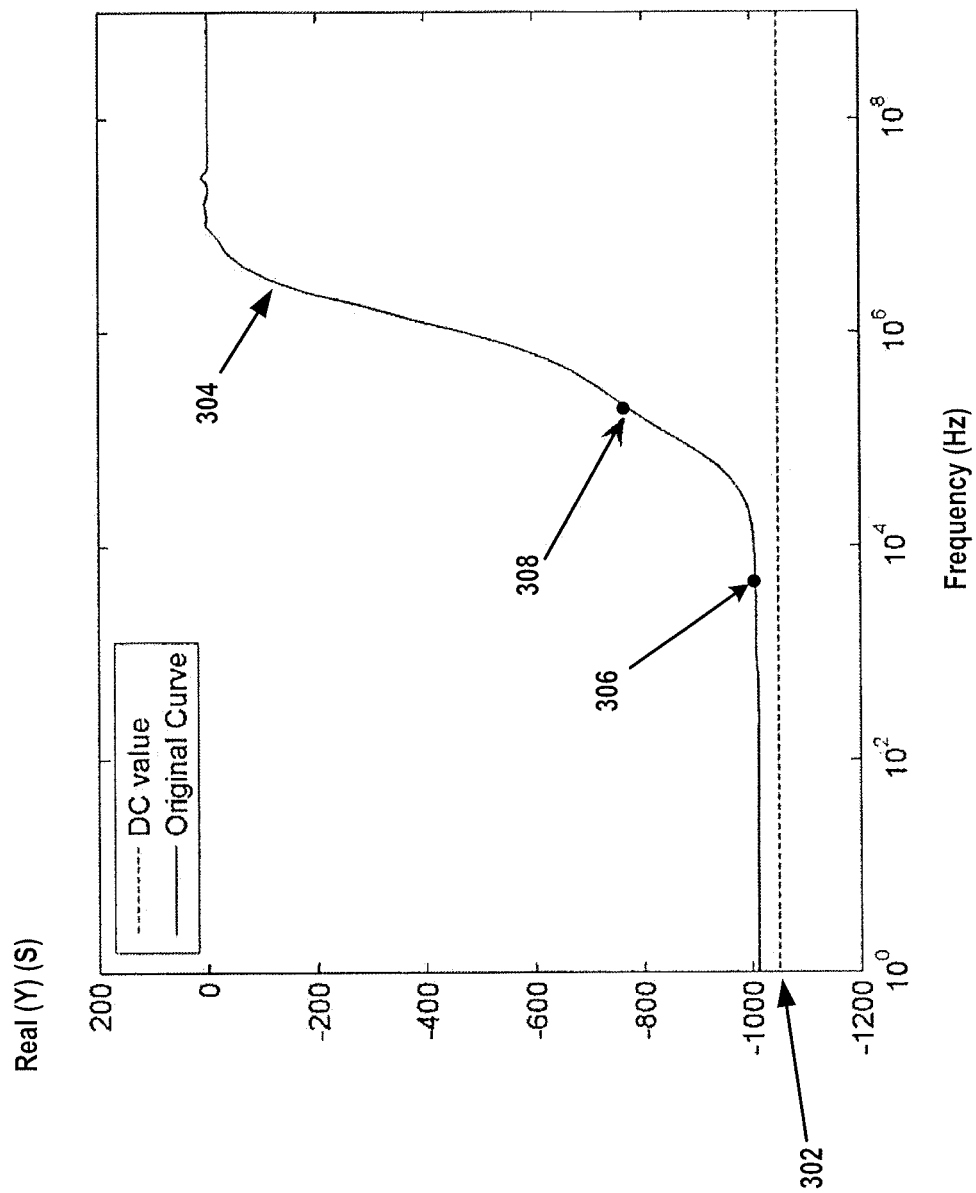
FIG. 3 illustrates exemplary curves and frequencies related to network parameter accuracy improvement, in accordance with some disclosed embodiments.

The impedance or admittance of a port in a network in a direct current (DC) condition (i.e., zero frequency), also referred to as a "DC value," can be determined accurately using, for example, circuit analysis, field analysis, measurement, or other methods. For example, FIG. 3 illustrates an exemplary DC value 302 (admittance, in the unit of Siemens or S), as shown as a dashed horizontal line in FIG. 3. It is noted that although this dashed line is plotted across a range of frequencies, the DC value 302 is actually a data point measured or calculated in DC (or zero frequency) condition.

Referring now to FIG. 3, curve 304, labeled as "Original Curve," is a curve of the real parts of admittance (Y) of a port over a frequency range (e.g., frequencies from $10^0$ to more than $10^8$ Hz). Curve 304 may include data points of discrete admittance values at different frequencies, and may also be fitted and/or smoothed to fit a portion or all of the data points under certain conditions (e.g., minimum errors). As discussed above, these data points (i.e., admittance values) may be converted from S-parameters measured or calculated for the port of the network under consideration. Similar curve containing impedance values can also be used in the analysis.

In FIG. 3, curve 304 contains a low frequency portion extending through DC point. It is noted that frequency $10^0$ is 1 Hz, and is not the DC point. DC point (zero frequency) is in fact cannot be shown in a log-scale frequency axis (such as the frequency axis in FIG. 3). Therefore, DC value 302 is plotted on the admittance axis (Real(Y)), as an approximation. It can be seen that the crossing point of curve 304 and the admittance axis is not the same as DC value 302, because curve 304 in the low frequency domain is not very accurate. To improve the accuracy, curve 304 is changed (fitted) to match DC value 302 in the lower frequency portion.

To change curve 304, a frequency sub-range (or transitional frequency range) needs to be defined. For example, in FIG. 3, frequency sub-range defined by frequency points 306 and 308 may be used in the accuracy improvement process. In one embodiment, lower frequency point 306 may be identified as a point above which curve 304 becomes unflat. Various methods can be utilized to determine the flatness of curve 304. For example, the slope of curve 304 can be determined and frequency point 306 may be identified as a point above which the slope exceeds a threshold. Alternatively or additionally, the derivatives of different orders can be calculated to determine the smoothness and/or flatness of curve 304. The lower frequency may range from 10 kHz to 10 MHz in different applications.

To identify the higher frequency point of the frequency sub-range, various methods may be utilized. In one embodiment, the higher frequency point may be determined based on an inter-plane coupling frequency. In a multi-layer circuit structure, the inter-plane coupling frequency can be determined by considering the thickness and the conductivity of a metal plane, where the metal plane may be sandwiched by a dielectric material or may enclose a dielectric material (e.g., ground or power plane). For example, if the thickness of a metal plane is D and the conductivity of the metal plane is σ, the inter-plane coupling frequency $f_{IPC}$ (also referred to as transition frequency) can be calculated as follows:

$$f_{IPC} = \frac{N^2}{\pi \mu_0 \mu_r \sigma D^2}. \quad (26)$$

In equation (26), N is an integer in the range of [1,10]; $\mu_0$ is permeability constant; and $\mu_r$ is relative permeability.

In some embodiments, both impedance and admittance parameters may be obtained by converting S-parameters, and a choice can be made between using the impedance and admittance parameters by considering the real parts of both impedance and admittance parameters at their low frequency portions. The parameter type having relatively constant real parts at its low frequency portion can be chosen as the one to be used in the accuracy improvement process.

After the parameter type and frequency sub-range are determined, the process may proceed to replace the real parts of the chosen parameter type (e.g., impedance or admittance parameters) with values derived from the DC value (obtained from methods specialized for DC analysis) of the corresponding type (e.g., impedance or admittance).

In one embodiment, the replacement may include replacing the real part of the chosen parameter type with the DC value for frequencies below the lower frequency point. Take curve 304 in FIG. 3 for example, the portion below frequency point 306 can be replaced by DC value 302. In other words, curve 304 is forced to match DC value 302 from DC up to frequency point 306.

For any data points in the frequency sub-range defined by frequency points 306 and 308, the real parts of admittance (or impedance) can be replaced by transitional values derived from DC value 302 and the admittance value (real part) at frequency point 308, so that the resulting curve after the replacement transits smoothly from DC value 302 at the lower frequency point 306 to the admittance value (real part) at frequency 308 within the frequency sub-range.

In one embodiment, the transitional values may be calculated by a polynomial function. For example, a second-order polynomial function $y=ax^2+bx+c$ may be used. Variables a, b, and c can be evaluated by taking x=frequency and y=admittance at different known points of the desirable curve. Then, the transitional value at any frequency within the sub-range may be calculated by the polynomial function. Other polynomial functions and/or smoothing functions may also be used to calculate the transitional value.

After the replacement, the impedance or admittance parameters with replaced real parts can be converted back to S-parameters to generate updated (or improved) S-parameters. The updated S-parameter may have an improved accuracy across a wide frequency range including low frequency domain and DC condition.

Figure 4A:
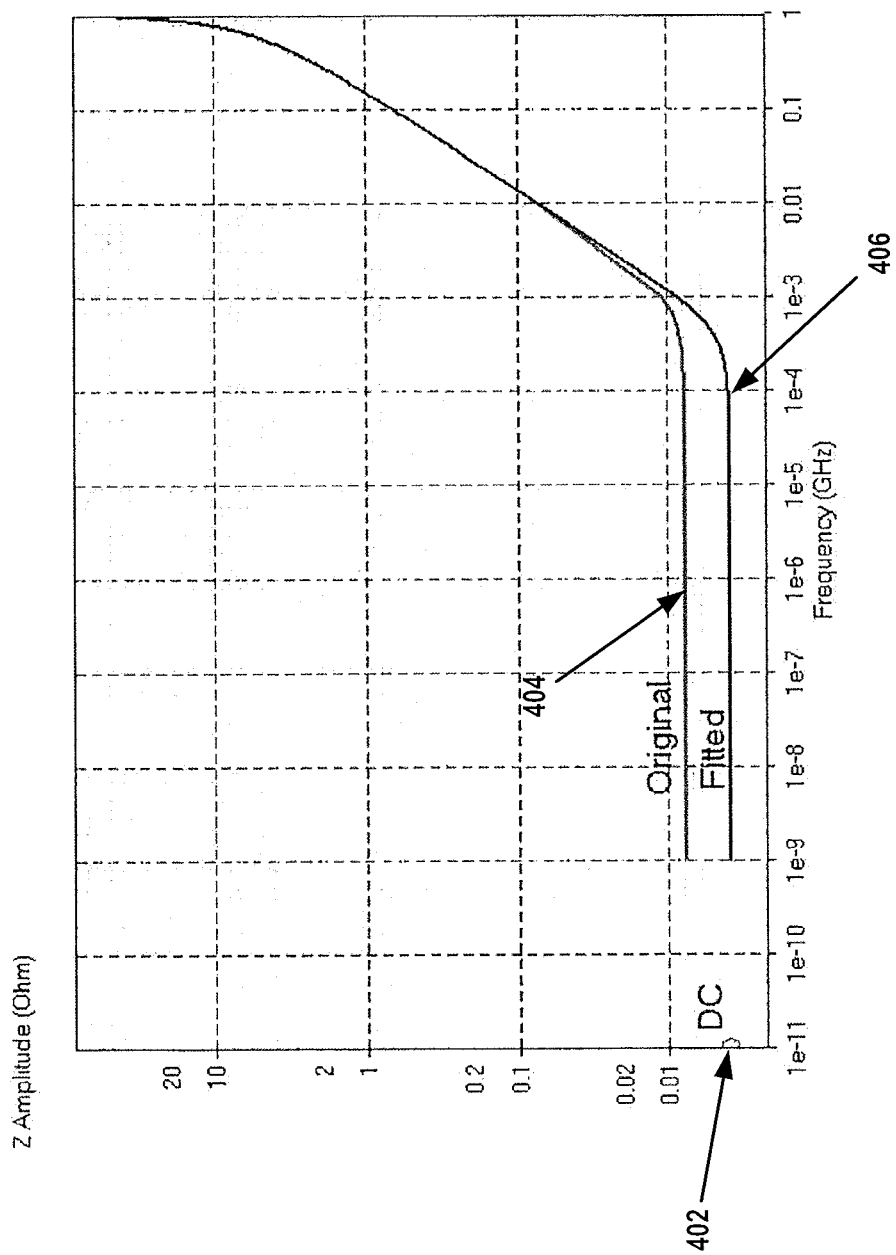
FIGS. 4A-4C illustrate exemplary results after network parameter accuracy improvement, in accordance with some disclosed embodiments.
Figure 4B:
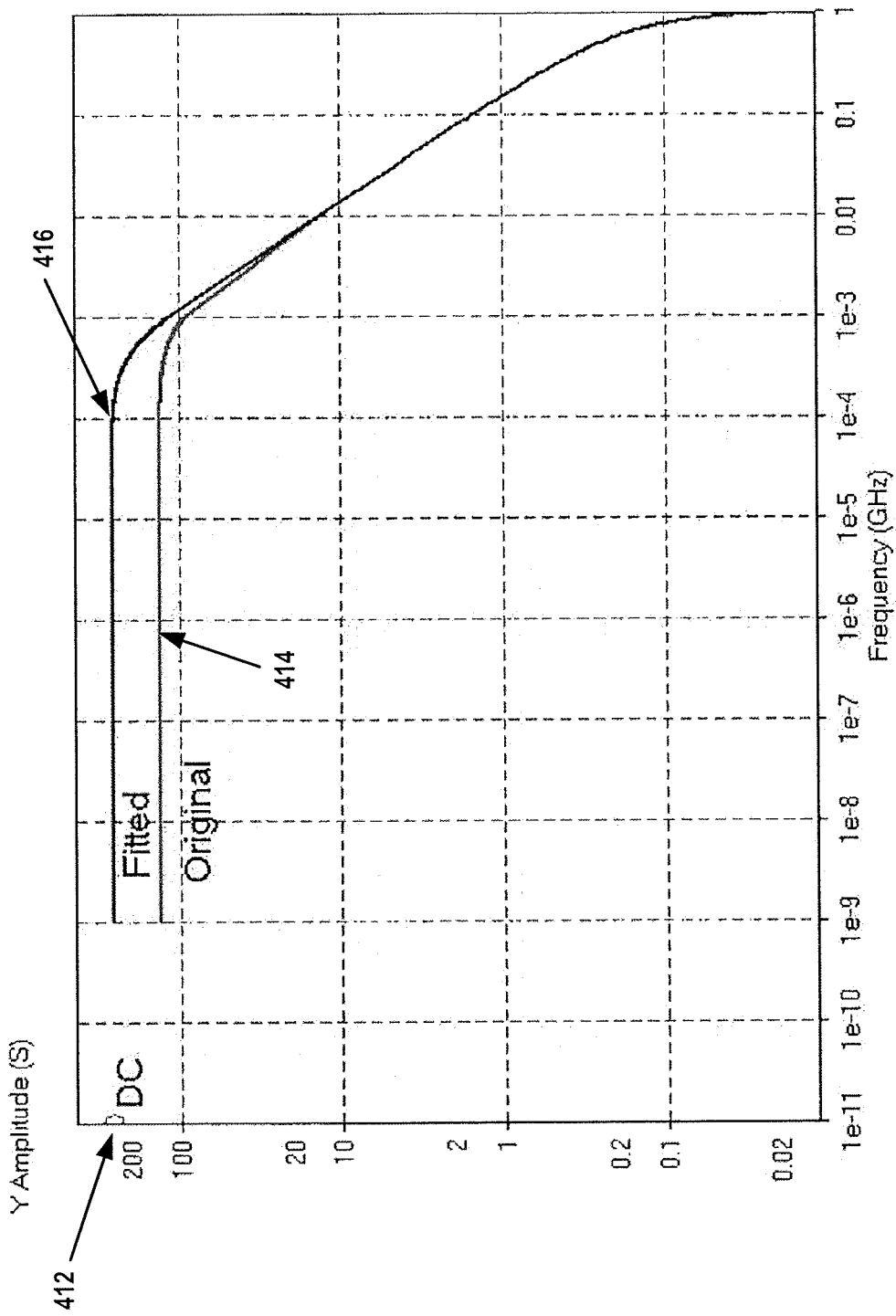
Figure 4C:
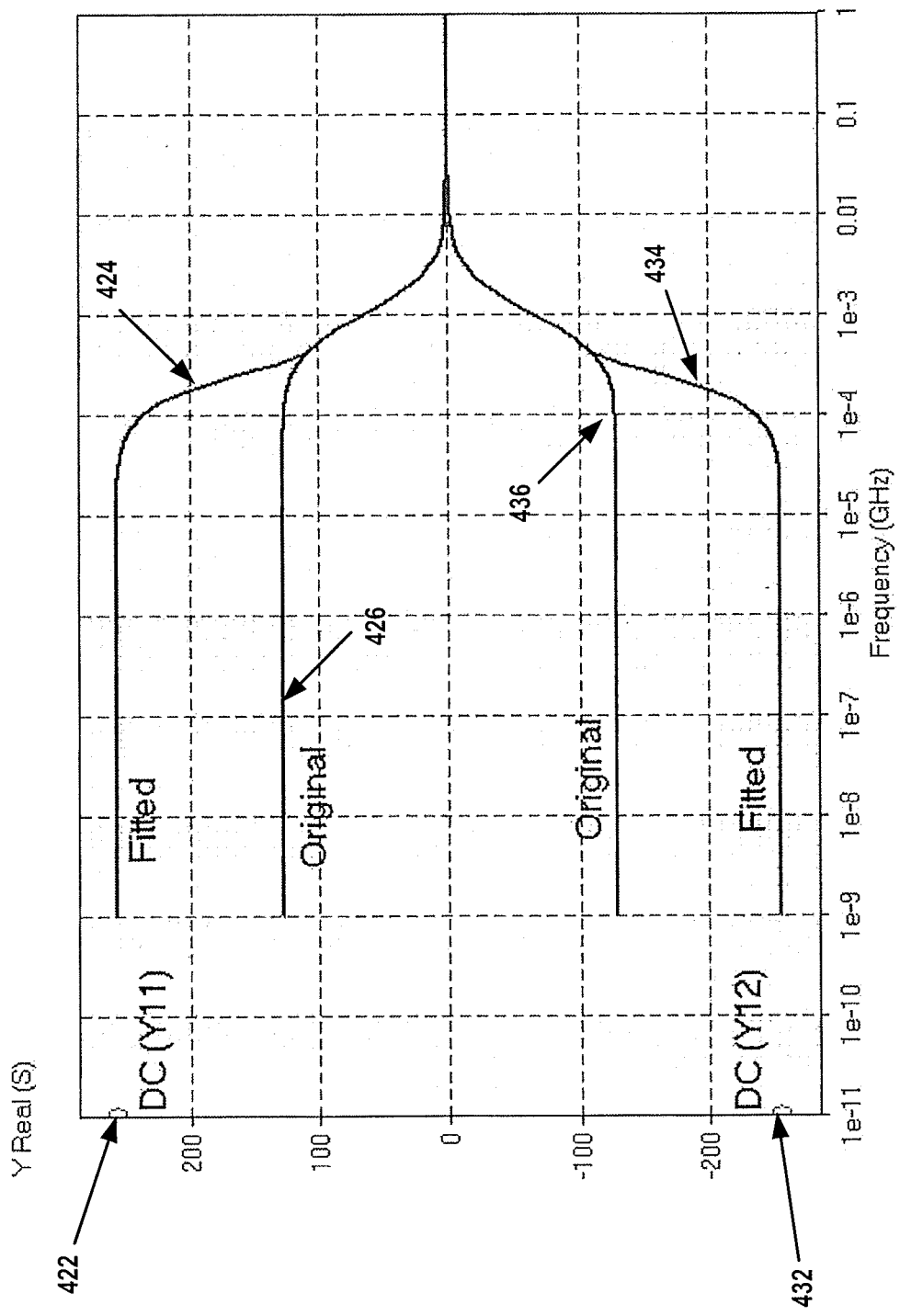

FIGS. 4A-4C illustrate exemplary results after network parameter accuracy improvement process. In FIG. 4A, impedance curves are used to change an original curve 404 based on a DC value 402. An improved (fitted) curve 406 has the same high frequency portion as curve 404, but at the same time transits smoothly to the accurate DC value 402 in the low frequency portion. FIG. 4B shows another improvement result using an admittance curve 414 and a DC value 412. Again, an improved (fitted) curve 416 transits smoothly from the high frequency portion to the accurate DC value 412. FIG. 4C shows improvement results of a two port network, where both $Y_{11}$ and $Y_{12}$ are improved. As for $Y_{11}$, original curve 426 is changed to curve 424 based on a DC value 422, where DC value 422 is measured or calculated based on admittance at port 1. Similarly, for $Y_{12}$, original curve 436 is changed to curve 434 based on another DC value 432, where DC value 432 is measured or calculated based on admittance between port 1 and port 2. It is noted that for multiple ports, a respect frequency sub-range can be determined for each network parameter (such as $Y_{11}$ and $Y_{12}$). The final frequency sub-range used in the accuracy improvement process can be defined by the lowest frequency and highest frequency across all frequency sub-ranges determined by the network parameters under consideration.

FIGS. 5A-5D show flow charts of exemplary methods for network parameter accuracy improvement. In FIG. 5A, a method 500 may include a series of steps, in accordance with some embodiments. In step 510, there may be provided a network model with one or more ports (e.g., network 200 with port 202). The network model may include at least one network parameter (e.g., S-parameter) defined over a frequency range (e.g., frequency range $10^0$ to $10^8$ in FIG. 3). In step 520, the network parameter (e.g., S-parameter) may be converted into an intermediate network parameter (e.g., Z-parameter or Y-parameter) having first and second portions (e.g., real and imaginary parts). In step 530, there may be provided a value indicative of an electrical property of the port in a direct current (DC) condition (e.g., DC value 302 in FIG. 3, which is indicative of port admittance). In step 540, first and second frequencies (e.g., frequencies 306 and 308 in FIG. 3) may be identified to define a frequency sub-range. In step 550, the first portion of the intermediate network parameter (e.g., real part of Z-parameter or Y-parameter) can be replaced with the value (e.g., DC value 302) when a frequency associated with the intermediate network parameter is lower than the first frequency (e.g., frequency at 306). In step 560, the first portion of the intermediate network parameter (e.g., real part of Z-parameter or Y-parameter) may be replaced with a transitional value (e.g., transitional value calculated by a polynomial function or a smoothing function) when a frequency associated with the intermediate network parameter is within the frequency sub-range (e.g., a portion of curve 304 starting at point 306 and ending at point 308). In step 570, the intermediate network parameter with the replaced first portion may be converted into an updated network parameter (e.g., an updated S-parameter). The dashed arrows above step 510 and below step 570 indicate that the method 500 may be part of another method that includes more steps.

Figure 5B:
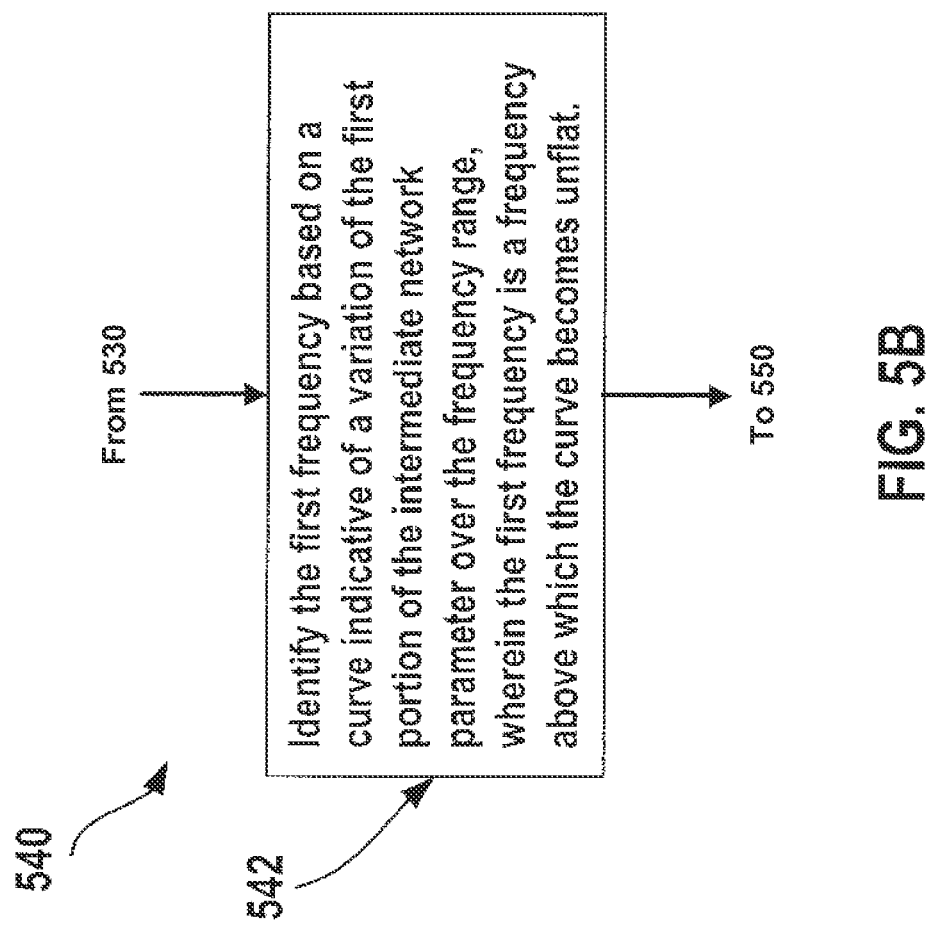

FIG. 5B shows an exemplary method of implementing a portion of step 540. In FIG. 5B, step 540 may include a step 542, where the first frequency can be identified based on a curve indicative of a variation of the first portion of the intermediate network parameter over the frequency range (e.g., curve 304), wherein the first frequency is a frequency above which the curve becomes unflat (e.g., frequency 306).

Figure 5C:
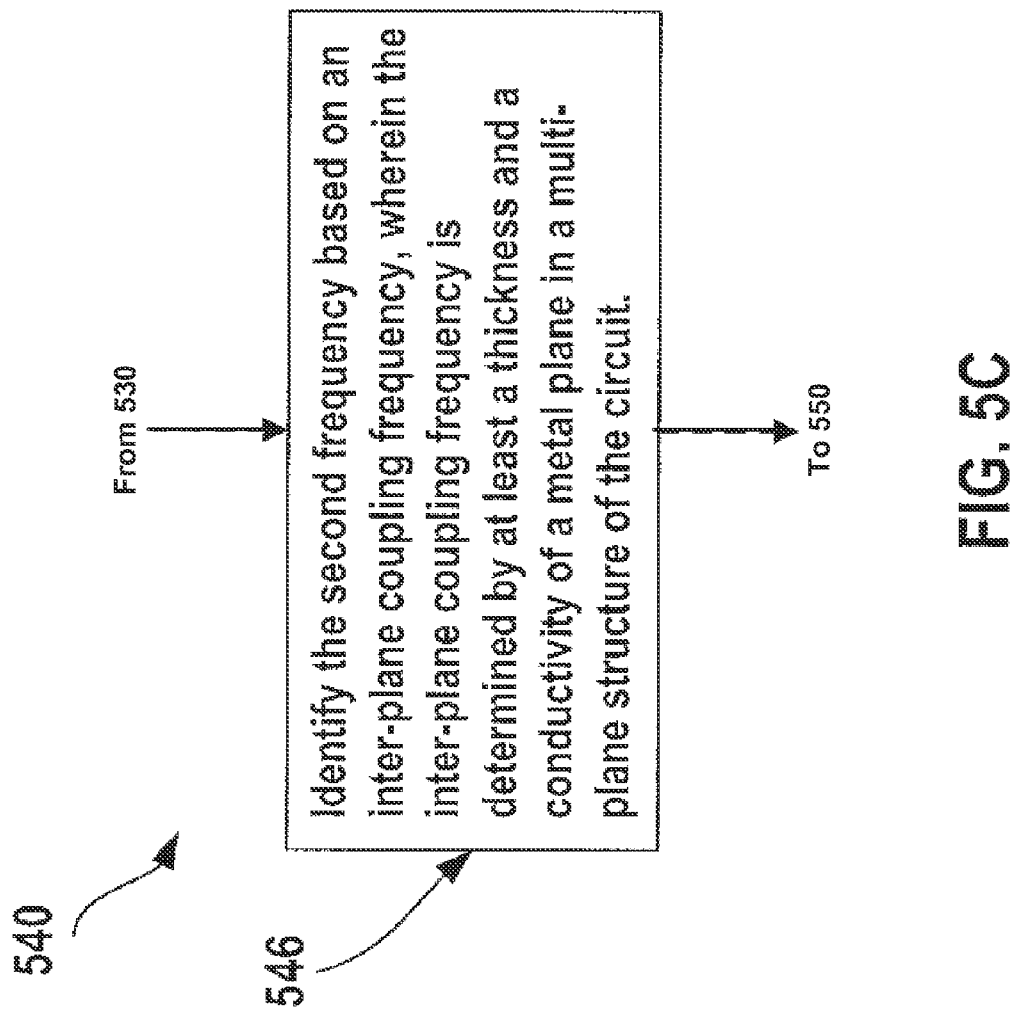

FIG. 5C shows an exemplary method of implementing another portion of step 540. In FIG. 5C, step 540 may include a step 546, where the second frequency can be identified based on an inter-plane coupling frequency, wherein the inter-plane coupling frequency is determined by at least a thickness and a conductivity of a metal plane is a multi-plane structure of the circuit (e.g., equation 26).

Figure 5D:
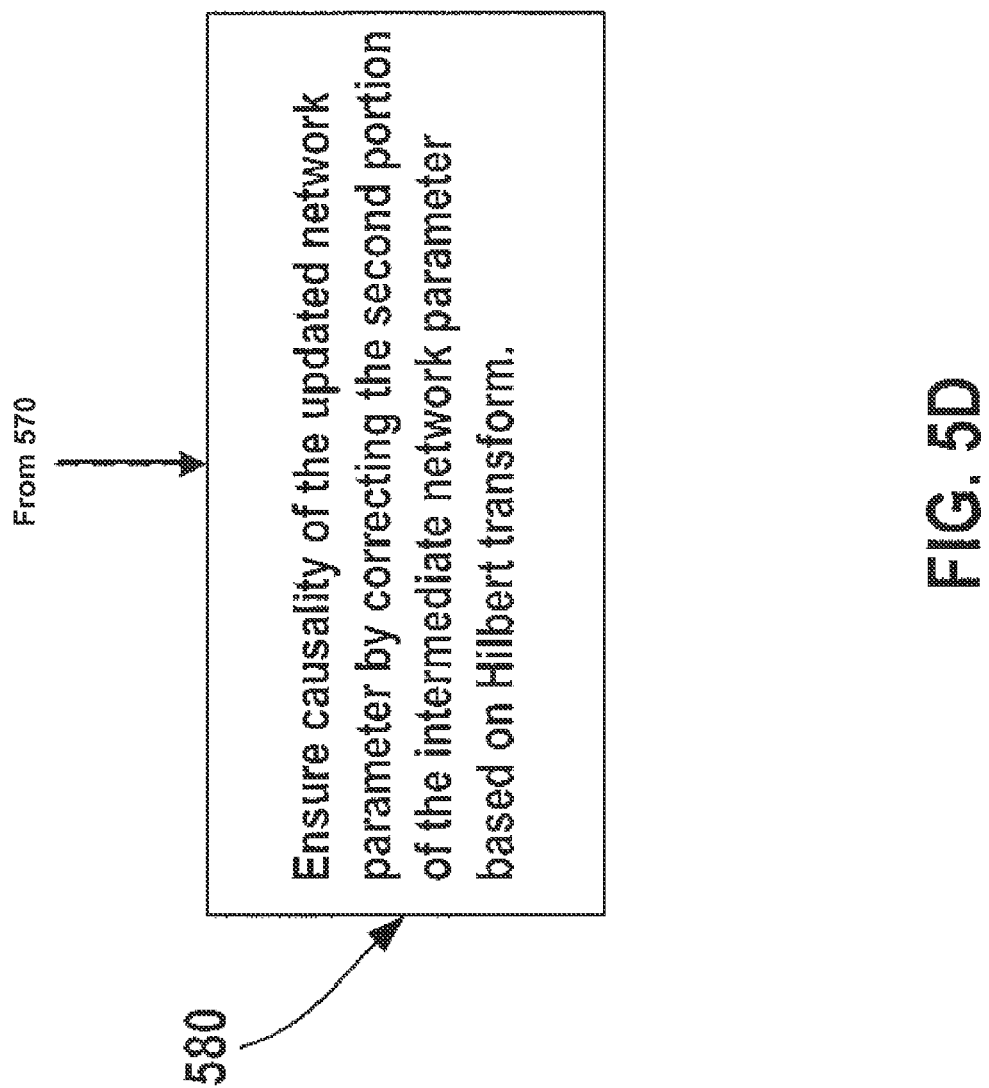

FIG. 5D shows an exemplary step 580 that can be performed after step 570 of FIG. 5A. In step 580, the second portion (e.g., imaginary part) of the intermediate network parameter may be corrected based on Hilbert transform to ensure causality of the updated network parameter. The real and imaginary parts of a network parameter can be related to each other. After the replacement steps 550 and 560, the real part of the network parameter is changed. This may affect the causality of resulting updated network parameter. Therefore, step 580 ensures the causality of the updated network parameter by correcting the imaginary part based on Hilbert transform.

The method and system disclosed herein are not limited to improve accuracy of S-parameters, other network parameters including: hybrid parameters (h-parameters), inverse hybrid parameters (g-parameters), transmission parameters (ABCD-parameters), and scattering transfer parameters (T-parameters) are also applicable. In addition, impedance parameters (z-parameters) and admittance parameters (y-parameters) can also be in a similar manner, without converting.

Moreover, while the examples discussed above are for one- or two-port network cases, the method and system can be applied to networks with more than two ports.

A simulation project may include one or more network models. For each model, similar process may be preformed to improve accuracy of network parameters.

In the foregoing Description of Exemplary Embodiments, various features are grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Exemplary Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A method, implemented by a computer, for analyzing electrical properties of a circuit, the method comprising:
   providing a network model of the circuit having at least one port, wherein the network model includes at least one network parameter, the network parameter being associated with the port and being defined over a frequency range;
   converting, by the computer, the network parameter into an intermediate network parameter; the intermediate network parameter having first and second portions;
   providing a value indicative of an electrical property of the port in a direct current (DC) condition;
   identifying first and second frequencies in the frequency range, the first frequency being lower than the second frequency, wherein the first and second frequencies define a frequency sub-range;
   replacing the first portion of the intermediate network parameter with the value when a frequency associated with the intermediate network parameter is lower than the first frequency;
   replacing the first portion of the intermediate network parameter with a transitional value when the frequency associated with the intermediate network parameter is within the frequency sub-range; and
   converting, by the computer, the intermediate network parameter with the replaced first portion into an updated network parameter.

2. The method of claim 1, wherein the network parameter is selected from a group consisting of:
   scattering parameters (S-parameters);
   hybrid parameters (h-parameters);
   inverse hybrid parameters (g-parameters);
   transmission parameters (ABCD-parameters); and
   scattering transfer parameters (T-parameters).

3. The method of claim 1, wherein the intermediate network parameter comprises impedance parameters (z-parameters).

4. The method of claim 3, wherein the value is a DC impedance of the port.

5. The method of claim 1, wherein the intermediate network parameter comprises admittance parameters (y-parameters).

6. The method of claim 5, wherein the value is a DC admittance of the port.

7. The method of claim 1, wherein the first and second portions of the intermediate network parameter are real and imaginary parts, respectively.

8. The method of claim 1, the step of identifying the first frequency further comprising:
   identifying the first frequency based on a curve indicative of a variation of the first portion of the intermediate network parameter over the frequency range, wherein the first frequency is a frequency above which the curve becomes unflat.

9. The method of claim 1, the step of identifying the second frequency further comprising:
   identifying the second frequency based on an inter-plane coupling frequency, wherein the inter-plane coupling frequency is determined by at least a thickness and a conductivity of a metal plane in a multi-plane structure of the circuit.

10. The method of claim 1, wherein the transitional value is calculated by at least one of: a smoothing function and a polynomial function.

11. The method of claim 1, further comprising:
    ensuring causality of the updated network parameter by changing the second portion of the intermediate network parameter based on Hilbert transform.

12. The method of claim 1, wherein:
    the network model includes first and second ports and first and second network parameters, each of the first and second network parameters being associated with at least one of the first and second ports, the first network parameter being defined over a first frequency range, the second network parameter being defined over a second frequency range;
    the step of converting the network parameter into the intermediate network parameter includes converting the first network parameter into a first intermediate network parameter and converting the second network parameter into a second intermediate network parameter; and the step of identifying includes:

identifying third and fourth frequencies in the first frequency range, the third frequency being lower than the fourth frequency;

identifying fifth and sixth frequencies in the second frequency range, the fifth frequency being lower than the sixth frequency;

assigning a lower frequency of the third and fifth frequencies to the first frequency; and assigning a higher frequency of the fourth and sixth frequencies to the second frequency.

13. A non-transitory computer-readable medium encoded with software code instructions, when executed by a computer, implementing a method for analyzing electrical properties of a circuit, the method comprising:

providing a network model of the circuit having at least one port, wherein the network model includes at least one network parameter, the network parameter being associated with the port and being defined over a frequency range;

converting, by the computer, the network parameter into an intermediate network parameter; the intermediate network parameter having first and second portions;

providing a value indicative of an electrical property of the port in a direct current (DC) condition;

identifying first and second frequencies in the frequency range, the first frequency being lower than the second frequency, wherein the first and second frequencies define a frequency sub-range;

replacing the first portion of the intermediate network parameter with the value when a frequency associated with the intermediate network parameter is lower than the first frequency;

replacing the first portion of the intermediate network parameter with a transitional value when the frequency associated with the intermediate network parameter is within the frequency sub-range; and converting, by the computer, the intermediate network parameter with the replaced first portion into an updated network parameter.

14. The non-transitory computer-readable medium of claim 13, wherein the network parameter is selected from a group consisting of:

scattering parameters (S-parameters);
hybrid parameters (h-parameters);
inverse hybrid parameters (g-parameters);
transmission parameters (ABCD-parameters); and
scattering transfer parameters (T-parameters).

15. The non-transitory computer-readable medium of claim 13, wherein the intermediate network parameter comprises impedance parameters (z-parameters).

16. The non-transitory computer-readable medium of claim 15, wherein the value is a DC impedance of the port.

17. The non-transitory computer-readable medium of claim 13, wherein the intermediate network parameter comprises admittance parameters (y-parameters).

18. The non-transitory computer-readable medium of claim 17, wherein the value is a DC admittance of the port.

19. The non-transitory computer-readable medium of claim 13, wherein the first and second portions of the intermediate network parameter are real and imaginary parts, respectively.

20. The non-transitory computer-readable medium of claim 13, wherein the method further comprises:

identifying the first frequency based on a curve indicative of a variation of the first portion of the intermediate network parameter over the frequency range, wherein the first frequency is a frequency above which the curve becomes unflat.

21. The non-transitory computer-readable medium of claim 13, wherein the method further comprises:

identifying the second frequency based on an inter-plane coupling frequency, wherein the inter-plane coupling frequency is determined by at least a thickness and a conductivity of a metal plane in a multi-plane structure of the circuit.

22. The non-transitory computer-readable medium of claim 13, wherein the transitional value is calculated by at least one of: a smoothing function and a polynomial function.

23. The non-transitory computer-readable medium of claim 13, wherein the method further comprising:

ensuring causality of the updated network parameter by changing the second portion of the intermediate network parameter based on Hilbert transform.

24. The non-transitory computer-readable medium of claim 14, wherein the method further comprises:

providing the network model including first and second ports and first and second network parameters, each of the first and second network parameters being associated with at least one of the first and second ports, the first network parameter being defined over a first frequency range, the second network parameter being defined over a second frequency range;

converting the first network parameter into a first intermediate network parameter and converting the second network parameter into a second intermediate network parameter;

identifying third and fourth frequencies in the first frequency range, the third frequency being lower than the fourth frequency;

identifying fifth and sixth frequencies in the second frequency range, the fifth frequency being lower than the sixth frequency;

assigning a lower frequency of the third and fifth frequencies to the first frequency; and assigning a higher frequency of the fourth and sixth frequencies to the second frequency.

25. A system for simulating electrical properties of a circuit, comprising:

a processor; and a memory communicatively coupled to the processor, wherein the processor is configured to:

load a network model of the circuit into the memory, wherein the network model includes at least one port and at least one network parameter, the network parameter being associated with the port and being defined over a frequency range;

convert the network parameter into an intermediate network parameter; the intermediate network parameter having first and second portions;

obtain a value indicative of an electrical property of the port in a direct current (DC) condition;

identify first and second frequencies in the frequency range, the first frequency being lower than the second frequency, wherein the first and second frequencies define a frequency sub-range;

replace the first portion of the intermediate network parameter with the value when a frequency associated with the intermediate network parameter is lower than the first frequency;

replace the first portion of the intermediate network parameter with a transitional value when the frequency associated with the intermediate network parameter is within the frequency sub-range; and
convert the intermediate network parameter with the replaced first portion into an updated network parameter.

26. The system of claim 25, wherein the network parameter is selected from a group consisting of:
scattering parameters (S-parameters);
hybrid parameters (h-parameters);
inverse hybrid parameters (g-parameters);
transmission parameters (ABCD-parameters); and
scattering transfer parameters (T-parameters).

27. The system of claim 25, wherein the intermediate network parameter comprises impedance parameters (z-parameters).

28. The system of claim 27, wherein the value is a DC impedance of the port.

29. The system of claim 25, wherein the intermediate network parameter comprises admittance parameters (y-parameters).

30. The system of claim 29, wherein the value is a DC admittance of the port.

31. The system of claim 25, wherein the first and second portions of the intermediate network parameter are real and imaginary parts, respectively.

32. The system of claim 25, wherein the processor is configured to:
identify the first frequency based on a curve indicative of a variation of the first portion of the intermediate network parameter over the frequency range, wherein the first frequency is a frequency above which the curve becomes unflat.

33. The system of claim 25, wherein the processor is configured to:
identifying the second frequency based on an inter-plane coupling frequency, wherein the inter-plane coupling frequency is determined by at least a thickness and a conductivity of a metal plane in a multi-plane structure of the circuit.

34. The system of claim 25, wherein the processor is configured to calculate the transitional value based on at least one of: a smoothing function and a polynomial function.

35. The system of claim 25, wherein the processor is configured to:
change the second portion of the intermediate network parameter based on Hilbert transform to ensure causality of the updated network parameter.

36. The system of claim 25, wherein the processor is configured to:
load the network model including first and second ports and first and second network parameters, each of the first and second network parameters being associated with at least one of the first and second ports, the first network parameter being defined over a first frequency range, the second network parameter being defined over a second frequency range;
convert the first network parameter into a first intermediate network parameter and convert the second network parameter into a second intermediate network parameter;
identify third and fourth frequencies in the first frequency range, the third frequency being lower than the fourth frequency;
identify fifth and sixth frequencies in the second frequency range, the fifth frequency being lower than the sixth frequency;
assign a lower frequency of the third and fifth frequencies to the first frequency; and
assign a higher frequency of the fourth and sixth frequencies to the second frequency.

* * * * *